United States Patent
Kapur et al.

(10) Patent No.: US 9,799,522 B2
(45) Date of Patent: *Oct. 24, 2017

(54) ALUMINUM OXIDE PASSIVATION AND DAMAGE REMOVAL FOR SOLAR CELLS

(71) Applicant: OB Realty, LLC, Irvine, CA (US)

(72) Inventors: Pawan Kapur, Burlingame, CA (US); Anand Deshpande, Milpitas, CA (US); Sean M. Seutter, San Jose, CA (US); Heather Deshazer, Palo Alto, CA (US); Virendra V. Rana, Los Gatos, CA (US); Solene Coutant, San Jose, CA (US); Swaroop Kommera, San Jose, CA (US); Mehrdad M. Moslehi, Los Altos, CA (US)

(73) Assignee: OB REALTY, LLC, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/632,696

(22) Filed: Feb. 26, 2015

(65) Prior Publication Data

US 2015/0311378 A1    Oct. 29, 2015

Related U.S. Application Data

(63) Continuation-in-part of application No. 14/557,096, filed on Dec. 1, 2014, now abandoned, which is a continuation-in-part of application No. 14/488,263, filed on Sep. 16, 2014, now abandoned.

(60) Provisional application No. 61/945,126, filed on Feb. 26, 2014, provisional application No. 61/910,271, filed on Nov. 29, 2013, provisional application No. 61/878,573, filed on Sep. 16, 2013, provisional application No. 61/898,504, filed on Nov. 1, 2013.

(51) Int. Cl.
| | | |
|---|---|---|
| *H01L 31/18* | (2006.01) | |
| *H01L 21/268* | (2006.01) | |
| *H01L 31/0216* | (2014.01) | |
| *H01L 31/068* | (2012.01) | |

(52) U.S. Cl.
CPC ...... *H01L 21/268* (2013.01); *H01L 31/02167* (2013.01); *H01L 31/0682* (2013.01); *H01L 31/1804* (2013.01); *Y02E 10/547* (2013.01); *Y02P 70/521* (2015.11)

(58) Field of Classification Search
CPC ......... H01L 31/18; H01L 31/00; H01L 31/02; H01L 31/0232; H01L 31/02327; H01L 31/028; H01L 31/022458; H01L 31/036; H01L 31/068; H01L 31/049; H01L 31/054; H01L 31/1864; H01L 21/22; H01L 21/26; H01L 21/268; H01L 21/2257
USPC .......................................................... 438/57
See application file for complete search history.

(56) References Cited

U.S. PATENT DOCUMENTS 4,891,331 A * 1/1990 Rapp ............................ 438/563
2008/0248596 A1* 10/2008 Das et al. ........................ 438/3
(Continued)

*Primary Examiner* — Chuong A Luu
(74) *Attorney, Agent, or Firm* — Howard IP Law Group, PC

(57) ABSTRACT

The present application provides effective and efficient structures and methods for the formation of solar cell base and emitter regions and passivation layers using laser processing. Laser absorbent passivation materials are formed on a solar cell substrate and patterned using laser ablation to form base and emitter regions. Laser damage to the solar cell substrate is removed using an etch.

4 Claims, 14 Drawing Sheets

(56) References Cited

U.S. PATENT DOCUMENTS

| | | | |
|---|---|---|---|
| 2014/0090701 A1* | 4/2014 | Rim .................. | H01L 31/03527 136/256 |
| 2015/0162486 A1* | 6/2015 | Deshazer ............ | H01L 31/1864 438/57 |
| 2015/0162487 A1* | 6/2015 | Deshazer ............. | H01L 21/268 438/57 |

* cited by examiner

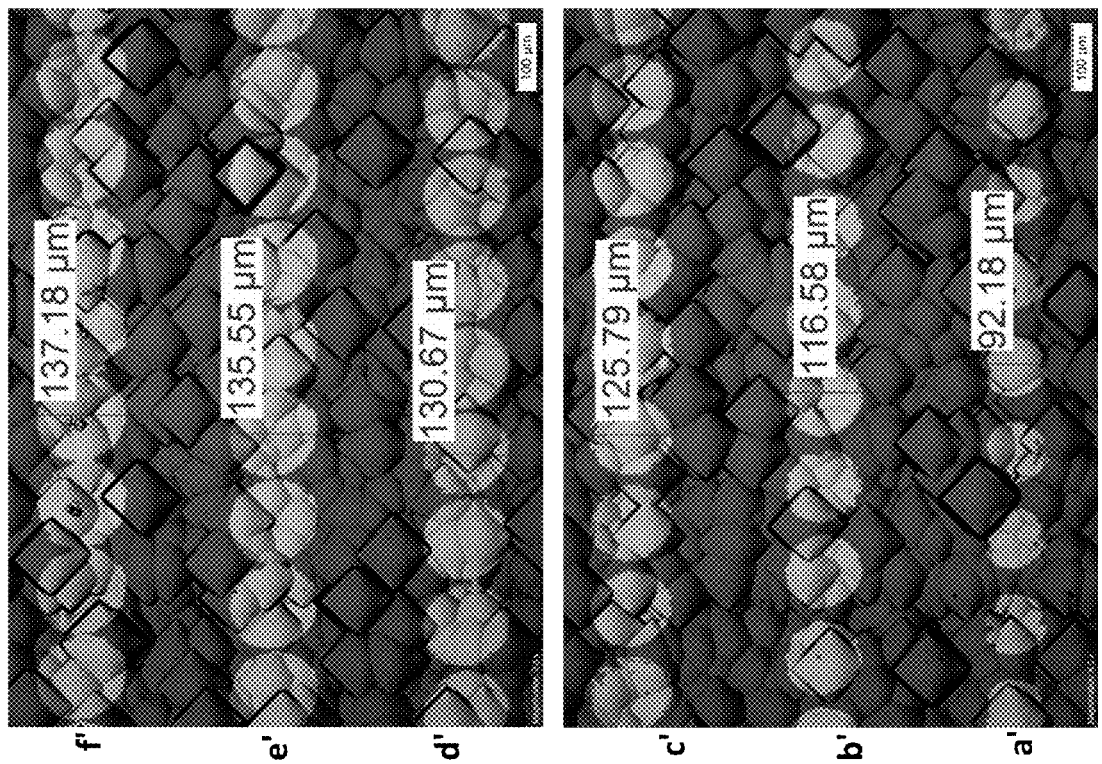
Fig. 6 (photograph)

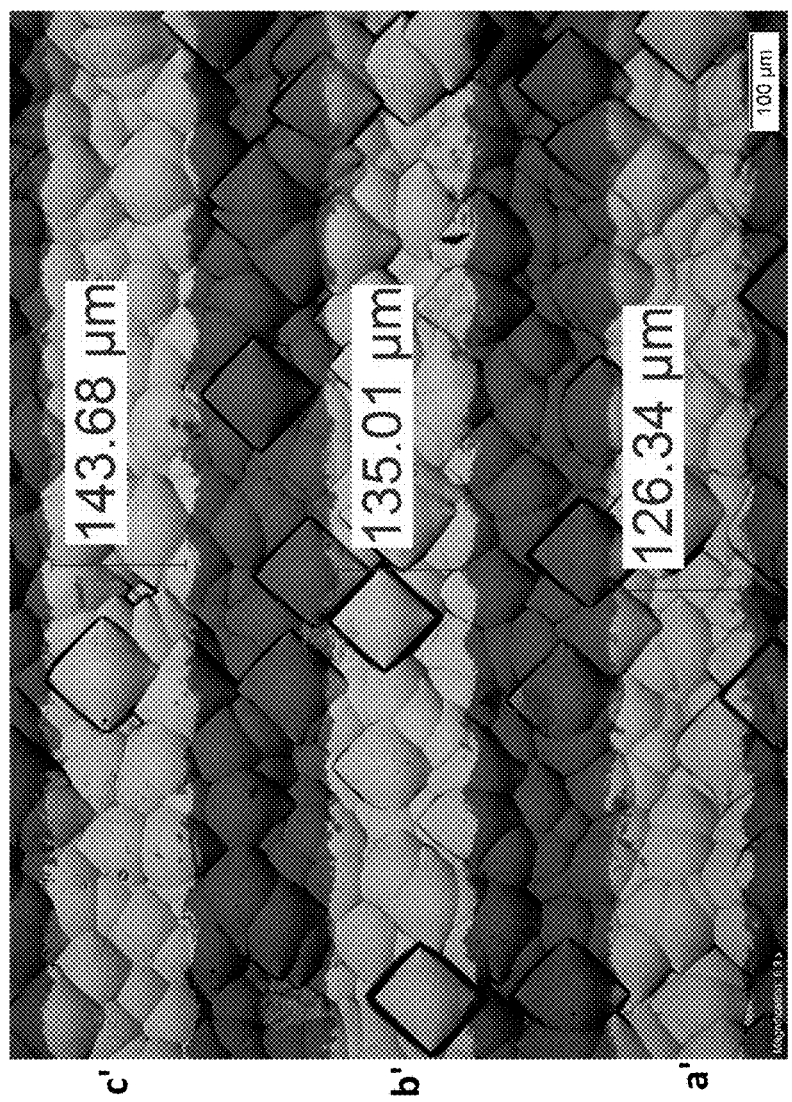
*Fig. 7 (photograph)*

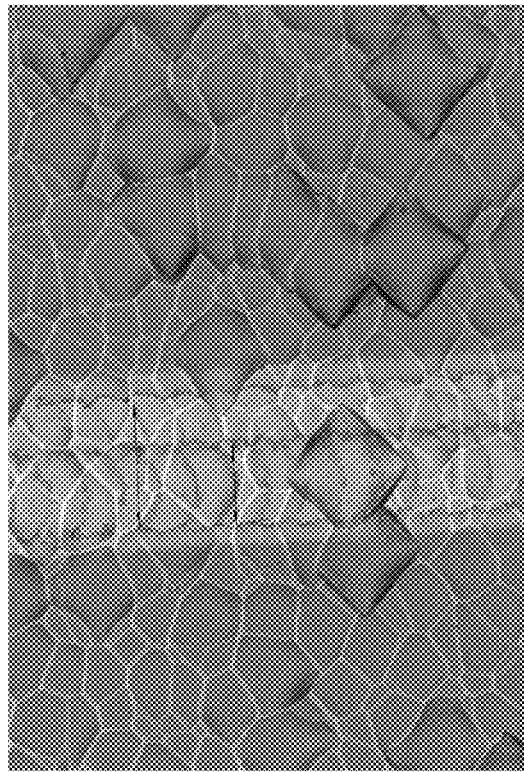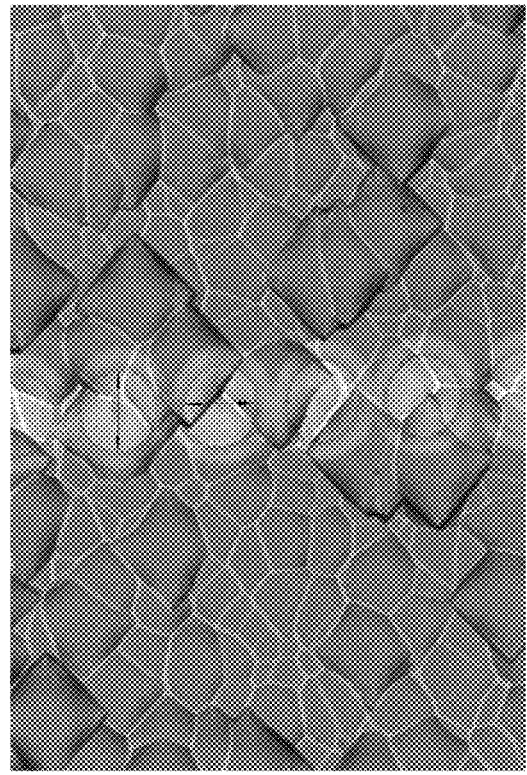
Fig. 8 (photograph)

Fig. 10 (photographs)

Fig. 12 (photograph)

ALUMINUM OXIDE PASSIVATION AND DAMAGE REMOVAL FOR SOLAR CELLS

CROSS-REFERENCE TO RELATED APPLICATIONS

This application claims the benefit of U.S. provisional patent application 61/945,126 filed on Feb. 26, 2014, which is hereby incorporated by reference in its entirety.

This application is a continuation in part of U.S. patent application Ser. No. 14/557,096 filed on Dec. 1, 2014 which claims the benefit of U.S. provisional patent application 61/910,271 filed on Nov. 29, 2013 and is a continuation in part of U.S. patent application Ser. No. 14/488,263 filed Sep. 16, 2014 which claims the benefit of U.S. provisional patent applications 61/878,573 filed on Sep. 16, 2013 and 61/898,504 filed on Nov. 1, 2013, all of which are hereby incorporated by reference in their entirety.

FIELD OF THE INVENTION

The present disclosure relates in general to the fields of photovoltaic (PV) solar cells, and more particularly to passivation for solar cells.

BACKGROUND

As photovoltaic solar cell technology is adopted as an energy generation solution on an increasingly widespread scale, fabrication and efficiency improvements relating to solar cell efficiency, metallization, material consumption, and fabrication are required. Manufacturing cost and conversion efficiency factors are driving solar cell absorbers ever thinner in thickness and larger in area, thus, increasing the mechanical fragility, efficiency, and complicating processing and handling of these thin absorber based solar cells—fragility effects increased particularly with respect to crystalline silicon absorbers.

Achieving high cell and module efficiencies in conjunction with a low fabrication cost is critical in solar cell development and manufacturing. Effective solar cell processing and structures emphasizing material and manufacturability considerations such as through-put and reliability while maintaining and/or improving solar cell structural designs and processing methods are gaining increasing importance for the widespread manufacture and adoption of solar energy generation.

Generally, solar cell base and emitter formation generally involves doping of a solar cell substrate (e.g., n type or p type) to form a pattern of base and emitter regions for corresponding contact metallization. Various known semiconductor solar cell substrate processing structures and methods exist for a combination of layer formation, doping, patterning, etc. required for solar cell base and emitter formation. These structures and methods may include for example a combination of lithography, etch, and/or diffusion, processing, etc.

However, often these traditional structures and methods may suffer from material and fabrication complexities and challenges, particularly related to cell structure and throughput and processing efficiency, as well as challenges limiting their applicability to leading edge solar cell designs.

BRIEF SUMMARY OF THE INVENTION

Therefore, a need has arisen for solar cell base and emitter formation that improve fabrication processes and provide increased solar cell performance. In accordance with the disclosed subject matter, for solar cell base and emitter formation and passivation methods are provided which substantially eliminates or reduces disadvantages and deficiencies associated with previously developed solar cell base and emitter formation methods.

According to one aspect of the disclosed subject matter a method for processing a solar cell is provided. A doped laser absorbent passivation layer is deposited on the surface of a solar cell. The doped laser absorbent passivation layer is patterned using laser ablation Annealing forms diffuse solar cell doped regions corresponding to the doped laser absorbent passivation layer.

These and other aspects of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGUREs and detailed description. It is intended that all such additional systems, methods, features and advantages that are included within this description, be within the scope of any claims.

BRIEF DESCRIPTION OF THE DRAWINGS

The features, natures, and advantages of the disclosed subject matter may become more apparent from the detailed description set forth below when taken in conjunction with the drawings in which like reference numerals indicate like features and wherein:

FIGS. 6 and 7 are MEMS photographs showing ablation patterns of aluminum oxide made using a nanosecond UV laser;

FIG. 8 is a MEMS photographs showing ablation patterns of aluminum oxide made using a picoseconds UV laser;

DETAILED DESCRIPTION

Figure 1:
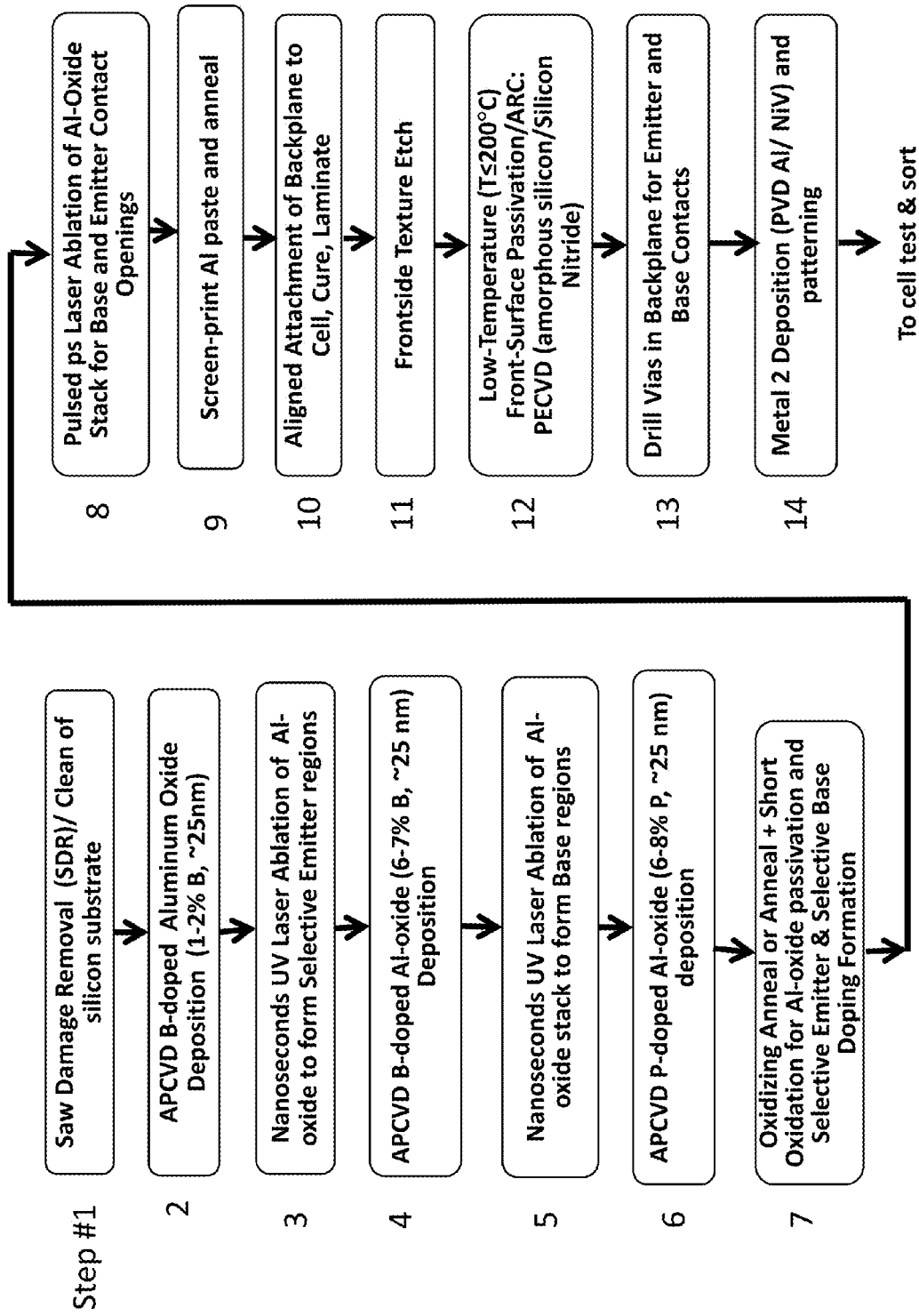
FIGS. 1 through 3 are process flows for forming a back contact back junction solar cells in accordance with the disclosed subject matter.

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings. The dimensions of drawings provided are not shown to scale.

And although the present disclosure is described with reference to specific embodiments and components, such as a back contact back junction silicon solar cell, one skilled in the art could apply the principles discussed herein to other solar cell structures (such as front contact or emitter wrap through—EWT-solar cells), solar cell semiconductor materials (such as GaAs, compound III-V materials), fabrication processes (such as various annealing methods and materials), as well as passivation materials (for example silicon nitride, amorphous silicon, or other non-densified passivation materials), technical areas, and/or embodiments without undue experimentation.

The present application provides effective and efficient structures and methods for the formation of solar cell base and emitter regions using laser processing. Laser patterning processes for the fabrication of back contact and front contact crystalline silicon solar cells are provided. Laser absorbent passivation materials are formed on a solar cell surface and patterned through laser ablation to form base and emitter regions. Optimal processing conditions relate to laser ablation parameters as well as passivation material properties to minimize or otherwise eliminate laser induced damage to an underlying semiconductor layer. The laser processing methods provided for solar cell base and emitter region formation in accordance with the disclosed subject matter may be integrated and/or combined into existing solar cell fabrication flows (e.g., for dopant patterning and/or diffusion).

The laser processing methods provided herein may be integrated and/or combined with the processes and structures disclosed in U.S. patent application Ser. No. 14/265,331 filed Apr. 29, 2014 which is hereby incorporated by reference in its entirety and U.S. Pat. Pub. No. 2014/0158193 published Jun. 12, 2014 which is hereby incorporated by reference in its entirety. FIG. 36 of U.S. patent application Ser. No. 14/265,331 is a process flow to form back-junction, back-contact solar cells using n-type silicon films or wafers of various thickness (e.g., thin films in the range of 10 microns 100 microns or wafers having a standard thickness, typically 150-180 microns) and a transparent silicon oxide passivation layer provided for descriptive purposes. In this process flow the laser ablation of oxide is performed using a picoseconds laser with UV (355 nm) wavelength to ablate the transparent silicon oxide through explosion of the underlying silicon, to form patterned selective emitter (lightly doped emitter junction with heavily doped emitter contact regions), patterned base, and metallization contact openings. Silicon oxide is transparent to wavelengths as short as 355 nm (UV) so the laser beam may pass through the oxide layer and damage the underlying silicon substrate. And although, the use of ultra-short pulse length such as picoseconds, and short wavelength such as UV, as well as other laser damage mitigation measures reduces and potentially eliminates damage to the underlying silicon, often damage may still be present.

FIGS. 37A and 37B of U.S. patent application Ser. No. 14/265,331 show a cross-sectional diagram of a solar cell resulting from the flow of FIG. 36 of U.S. patent application Ser. No. 14/265,331. Laser patterning is carried out by opening up the desired amount of area for selective emitter (i.e., lightly doped emitter junctions in conjunction with heavily doped emitter contact) and selective base (i.e., lightly doped base region in conjunction with heavily doped base contact) regions. The selective emitter (SE) and selective base (SB) regions may be opened up by the laser ablation that are doped with the emitter dopant (p-type emitter such as boron-doped emitter for n-base), and base dopant (n-type base such as phosphorus-doped base for n-base), respectively. These selective emitter and selective base contacts may be continuous line patterns or discrete spot-in-spot patterns where the SE and SB openings are not overlapped and the contacts openings are aligned to be isolated within the SE and Base openings (preferably with a single contact opening per discrete base island). For example see U.S. Pat. Pub. No. 2014/0158193 incorporated by reference in its entirety. The contacts to these selective emitter and base regions may be formed by a subsequent laser ablation step, for example as outlined in the process flow of FIG. 36 of U.S. patent application Ser. No. 14/265, 331.

FIGS. 38A and 38B of U.S. patent application Ser. No. 14/265,331 are photographs showing the nature of laser damage of ablating transparent silicon oxide using a Gaussian laser beam with approximately ten picoseconds pulse width and 355 nm wavelength (UV). FIG. 38A of U.S. patent application Ser. No. 14/265,331 is a photograph of an ablation spot where too high a laser fluence was used. There is extensive damage in the center of the spot due to the high power at the Gaussian peak and ripples extending towards the ablation edge. This crystalline lattice damage can be reduced by lowering the laser fluence to the minimum required for ablation. FIG. 38B U.S. patent application Ser. No. 14/265,331 is a photograph of an ablation spot using a lower laser fluence. Ripples may also be observed in the laser-ablated spots.

Laser processing using passivation layers transparent to the laser wavelength often may result in laser damage to underlying silicon. However, if the passivation layer is made absorbent to the laser beam a significant amount of laser radiation from reaching the silicon substrate may be prevented and damage free or negligible damage ablation and laser patterning may be facilitated. This may be particularly advantageous in combination with thermally robust passivation layers (i.e., able to withstand and maintain material characteristics at high temperatures which may be required for solar cell processing) such as aluminum oxide. Aluminum oxide $Al_2O_3$ is an advantageous material for the passivation of p and p+ type crystalline silicon surfaces in part because of its fixed negative charge. And although, crystalline aluminum oxide is transparent to light wavelength down to UV (355 nm), low temperature deposition of aluminum oxide may lead to amorphous or non-densified (i.e., non-crystalline) films. Amorphous or non-densified aluminum oxide may be formed by $Al_2O_3$ deposition at lower temperatures, for example at a temperature less than 450° C., for example at 380° C. Nevertheless, the absorption in certain usable wavelength ranges, for example such as UV to IR, may not be significant. Films deposited using APCVD (atmospheric pressure chemical vapor deposition) having an excess of oxygen such that the layer has a non-zero extinction coefficient and can absorb laser beam in the UV to IR (1064 nm) range (deposition factors such as temperature and deposition rate may contribute to extinction coefficient), with the absorption being higher for shorter wavelengths. Alternatively, a metal rich aluminum oxide passivation layer may also be laser absorbent in the UV to IR range. Often, for manufacturing purposes, it is desirable to minimize the thickness of these passivation films to be as thin as possible and it may be preferable to use UV wavelength laser. However, APCVD deposited amorphous silicon films with the desired excess of oxygen suitable for laser ablation typically do not provide adequate passivation to the silicon surface. Thus, subsequent to laser ablation, suitable annealing is carried out as a part of the process flow, such as that outlined in FIG. 1, to oxidize and change the film structure so that the passivation properties are maximized.

Laser processing parameters may be selected for the ablation of passivation films. For absorptive films the thickness of films removed by pulsed laser ablation may depend not only on the pulse energy and wavelength but also on the pulse length. Thicker films are removed at higher pulse energy. Since longer wavelengths penetrate deeper, depending on the thickness of the film to be removed/ablated, a suitable wavelength in the range of IR to UV can be selected. However, pulse length also has a strong effect. Nanoseconds pulse length may be advantageous in limiting damage to the underlying silicon. Picoseconds pulses may cause cold ablation where the material dissociates because of coulombic repulsion as the electrons are stripped away from the atoms. This may be more effective than the removal of material by heating and evaporation. Also, ablation using picosecond pulse length forms smaller particles because of the separation instigated by this coulombic repulsion. These particles are readily removed using an air knife and exhaust. Hence, picoseconds lasers can be advantageous in removing thicker films without the particle problem.

It should be clear to workers familiar with laser processing the selection of picoseconds or nanosecond pulses and IR, green, or UV wavelength may vary for ablating a certain thickness of an absorptive aluminum oxide film.

Generally, damage free ablation of aluminum oxide is achieved by making the film absorbent to the laser radiation used. While crystalline aluminum oxide films are transparent to the typical wavelengths used for laser ablation (UV to IR), amorphous aluminum oxide films deposited under suitable process conditions can be absorptive to these wavelengths. The laser ablation of such films under suitable conditions can lead to damage free solar cell patterning processes since the laser energy is prevented from damaging the underlying silicon substrate.

FIGS. 6 and 7 are MEMS photographs showing ablation patterns of aluminum oxide made using a nanosecond UV laser under various conditions. FIG. 8 is a MEMS photographs showing ablation patterns of aluminum oxide made using a picoseconds UV laser. In a specific instance, laser parameter selection for ablation of absorptive aluminum oxide films, which may partially depend on aluminum oxide thickness, may include nanoseconds UV laser having a pulse width in the range of 1 to 100 nanoseconds and in some instances 1 to 30 nanoseconds. For example, in some instances for an aluminum oxide film having a thickness in the range of 40 to 60 nm and an undoped silicon oxide cap a UV laser having a pulse width of 30 nanoseconds may be used.

The flow of FIG. 1 is consistent with the process flow of FIG. 36 in U.S. patent application Ser. No. 14/265,331 filed Apr. 29, 2014 incorporated by reference in its entirety. FIG. 1 is a process flow for forming a back contact back junction solar cell starting with an n-type silicon where laser absorbent, doped aluminum oxide is substituted for the silicon oxide of FIG. 36 in U.S. patent application Ser. No. 14/265, 331 to obtain laser damage free emitter and base patterning. Thin layers of aluminum oxide (e.g., preferably very thin layers having a thickness greater than 5 microns and in some instances in the range of 10 to 50 nm) may be used for throughput and cost reasons. Thicker films of $Al_2O_3$ may also be used which can also facilitate the use of higher wavelengths such as green or IR. Optionally, if required, undoped aluminum oxide cap layers may be used to facilitate integration with existing solar cell fabrication flows and particularly to prevent the evaporation loss of dopants, dopant intermixing, and penetration of thinner aluminum oxide films by metal. Capping layers include materials such as undoped aluminum oxide and undoped silicon oxide which may, for example, have a thickness in the range of 100 to 600 nm. The process flow shown in FIG. 1 may be used on thin films of silicon having a thickness as thin as approximately 10 microns and as thick as approximately 100 microns.

Figure 2:
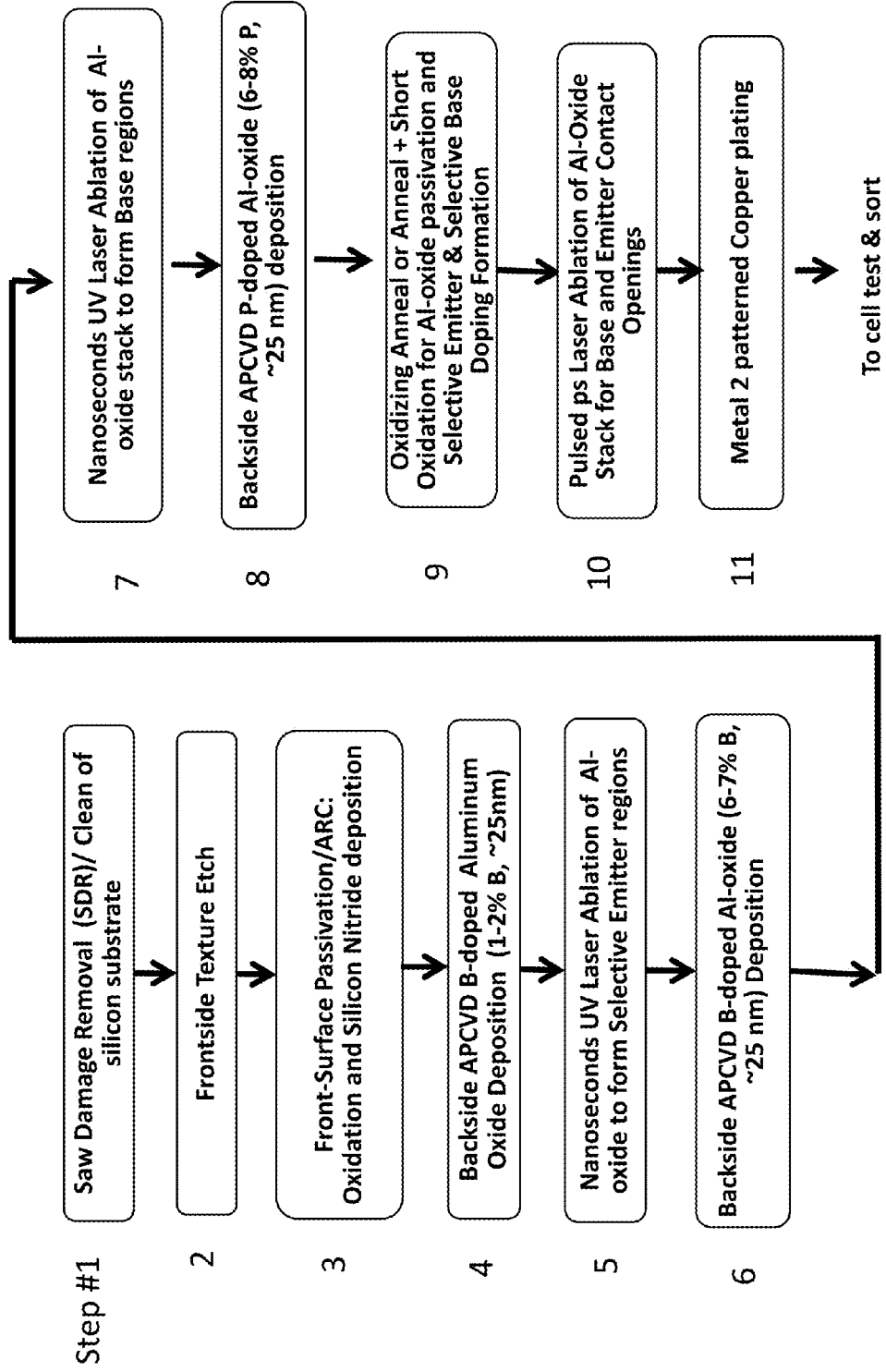

FIG. 2 is a process flow for forming a back contact back junction solar cell starting with an n-type silicon using laser absorbent doped aluminum oxide suitable on a thicker starting wafer (for example having a thickness in the range of approximately 100 to 200 microns) as compared to the starting wafer of FIG. 1. Note a supporting backplane is not used in the flow of FIG. 2.

Figure 3:
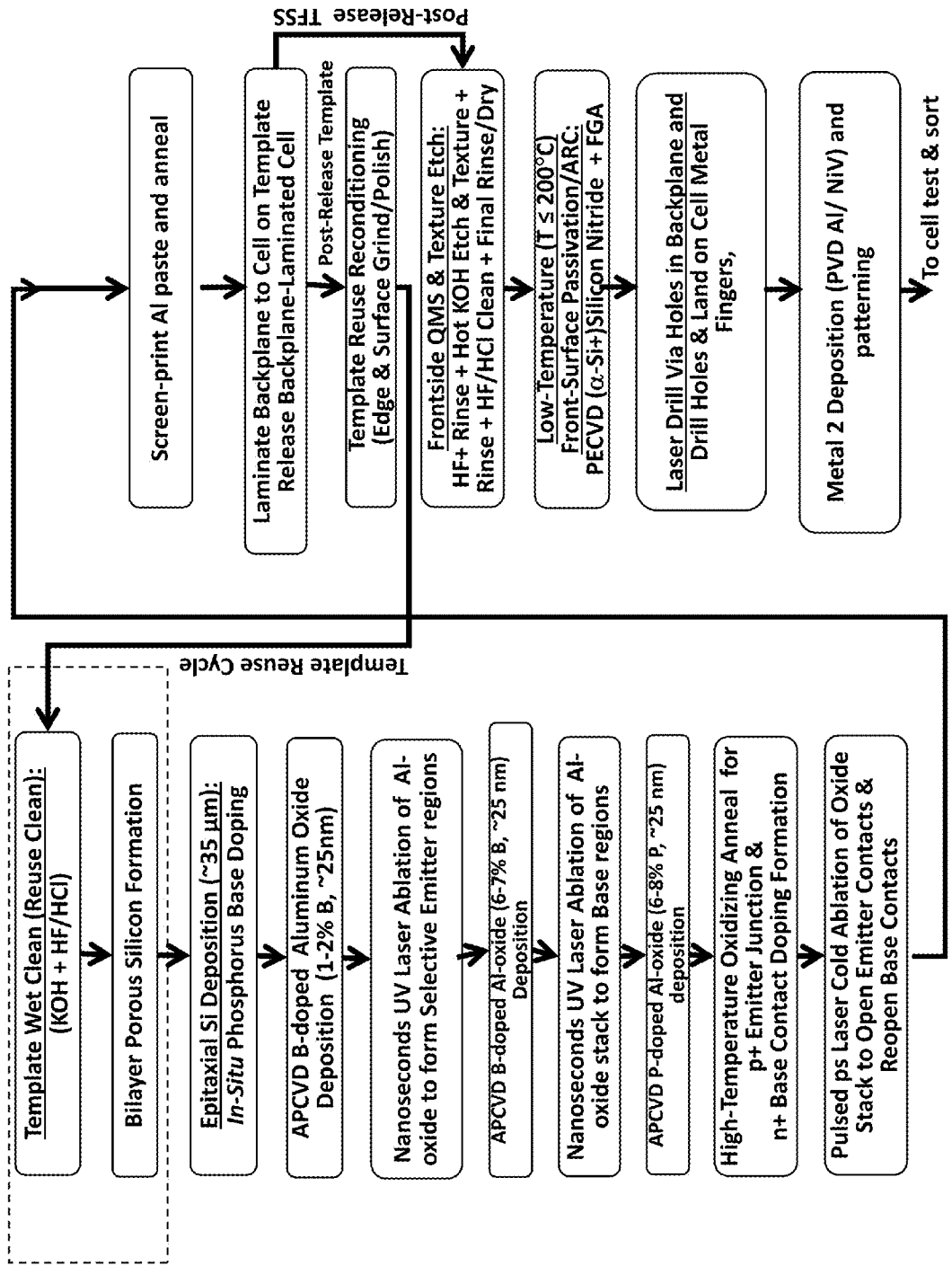

FIG. 3 is a process flow for forming a back contact back junction solar cell using a starting thin silicon film formed via an epitaxial deposition on porous silicon lift-off process.

Figure 4:
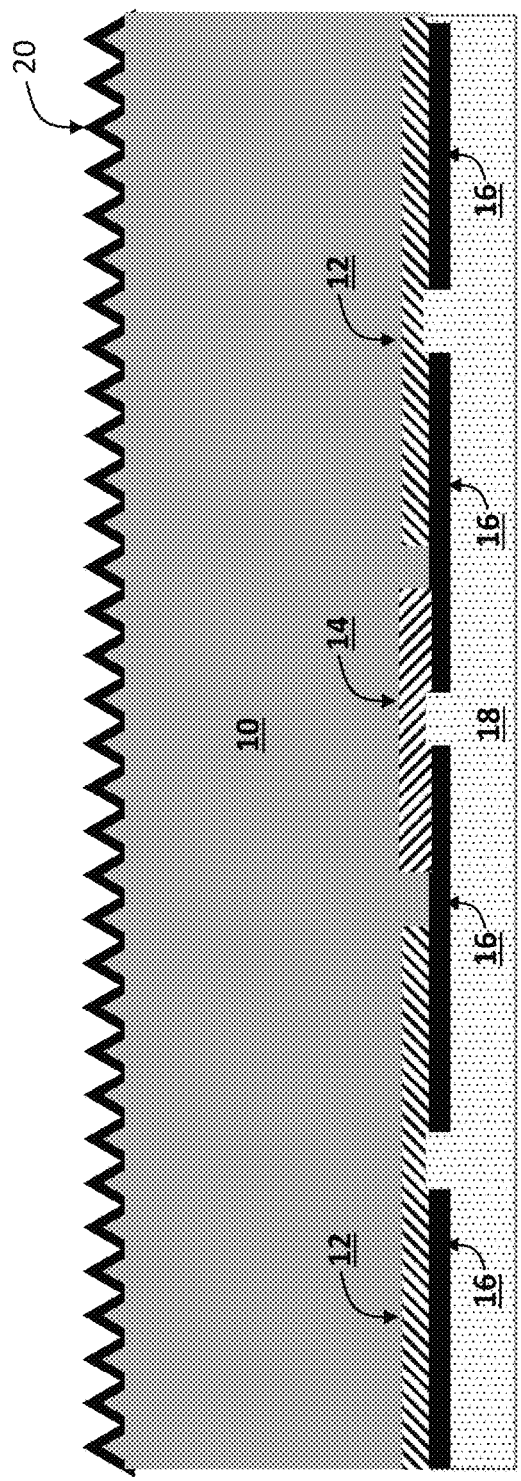
FIG. 4 is a cross-sectional diagram of a back contact back junction solar cell.

FIG. 4 is a cross-sectional diagram of a resulting back contact back junction solar cell formed according to the back contact back junction solar cell process flows provided herein. A Textured solar cell frontside 20 (for example coated with an amorphous silicon/PECVD nitride layer) is on the front/light receiving side of silicon solar cell substrate 10 (for example having n-type base). P+ emitter regions 12 and n++ base regions 14 are contacted to metallization layer 18 (for example an aluminum/nickel vanadium/tin stack) through aluminum oxide passivation layer 16 (for example an aluminum oxide stack).

Figure 5:
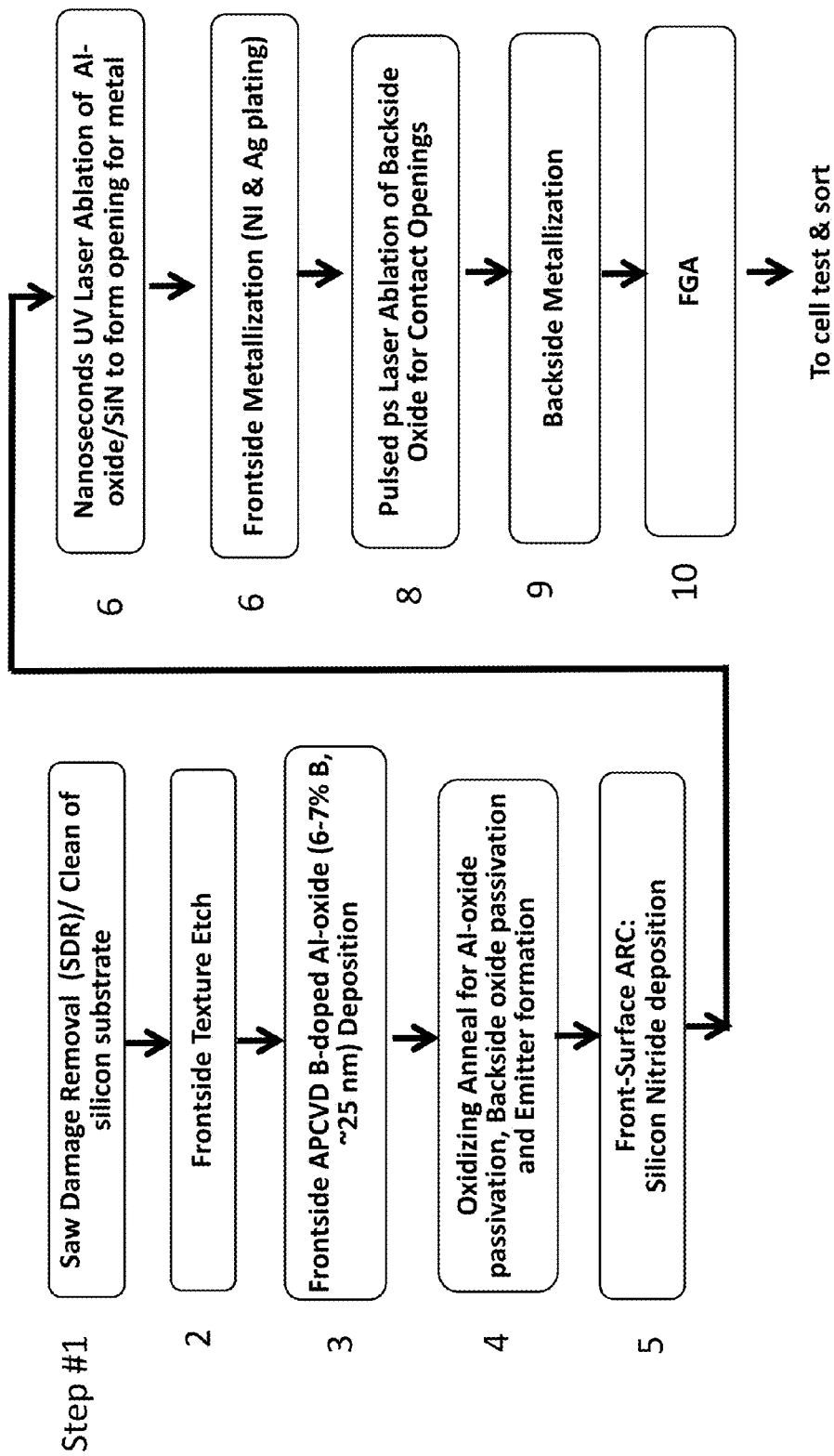
FIG. 5 is a process flow for forming a front contact solar cell in accordance with the disclosed subject matter.

FIG. 5 is a process flow for forming a front contact solar cell starting with an n-type silicon wafer. Laser absorbent aluminum oxide is used to define a fine line metallization pattern.

FIGS. 6 and 7 are MEMS photographs showing ablation patterns of aluminum oxide made using a nanosecond UV laser under various conditions. FIG. 6 is a photograph showing ablation spots formed in aluminum oxide using a 30 nanosecond, UV laser with pulse energies (in micro joules) of: a'=52, b'=95, c'=141, d'=183, e'=216, and f'=234. FIG. 7 is a photograph showing ablation scribes (lines) formed in aluminum oxide using a 30 nanosecond, UV laser with laser fluences (in $J/cm^2$) of: a'=0.6, b'=00.7, and c'=0.74.

FIG. 8 is a MEMS photographs showing ablation patterns of aluminum oxide made using a picoseconds UV laser. FIG. 8 is a photograph showing ablation scribes formed in aluminum oxide using a 12 picosecond, UV laser with FIG. 8 photograph A showing isolated spot patterning and FIG. 8 photograph B showing continuous line patterning.

And although the present disclosure is described with reference to specific embodiments and components, such as a back contact back junction silicon solar cell, one skilled in the art could apply the principles discussed herein to other solar cell structures (such as front contact or emitter wrap through—EWT-solar cells), fabrication processes (such as various deposition, contact opening, and diffusion methods and materials), as well as absorber/metallization materials and formation (such as silicon wafer based solar cells, epitaxially grown silicon solar cells, GaAs or compound semiconductor materials), technical areas, and/or embodiments without undue experimentation.

The following are provided for descriptive purposes as exemplary embodiments. Importantly, the drawings provided herein depicting aspects of solar cell cross-sections are not drawn to scale.

The aluminum oxide ($Al_2O_3$) based back contact back junction (BCBJ) solar cell solutions described provide and are consistent with the following motivational guidelines:

Provide higher efficiency through several advantages such as those outlined below.

Provide back contact back junction solar cells which are stable under UV and do suffer minimal to zero from light induced degradation.

Reduce the number of process steps in the manufacturing of the back contact back junction solar cell.

The process flows described below are provided for the manufacture high efficiency n-type thin silicon (for example from 15 um to 100 um thick), back junction back contact solar cells similar to the process flows above. Various aspects of each flow may be combined or removed, added, or otherwise altered consistent with the inventive aspects provided herein. In the methods described, because the solar absorber is thin it may be supported by and handled using a backplane (e.g., made of prepreg material). In addition, the backplane (e.g., prepreg) may be used to thin a CZ wafer down as well as handle the wafer through remaining process steps. Using this method, a relatively low lifetime wafer may be used to manufacture a very high efficiency cell—as the wafer's thickness is reduced (while having a viable manufacturing solution) to an extent such that it becomes much less than the diffusion length of the minority carriers. And the use of lower lifetime wafers may substantially reduce the cost of the starting wafer while being conducive to a high efficiency solar cell.

Figure 9:
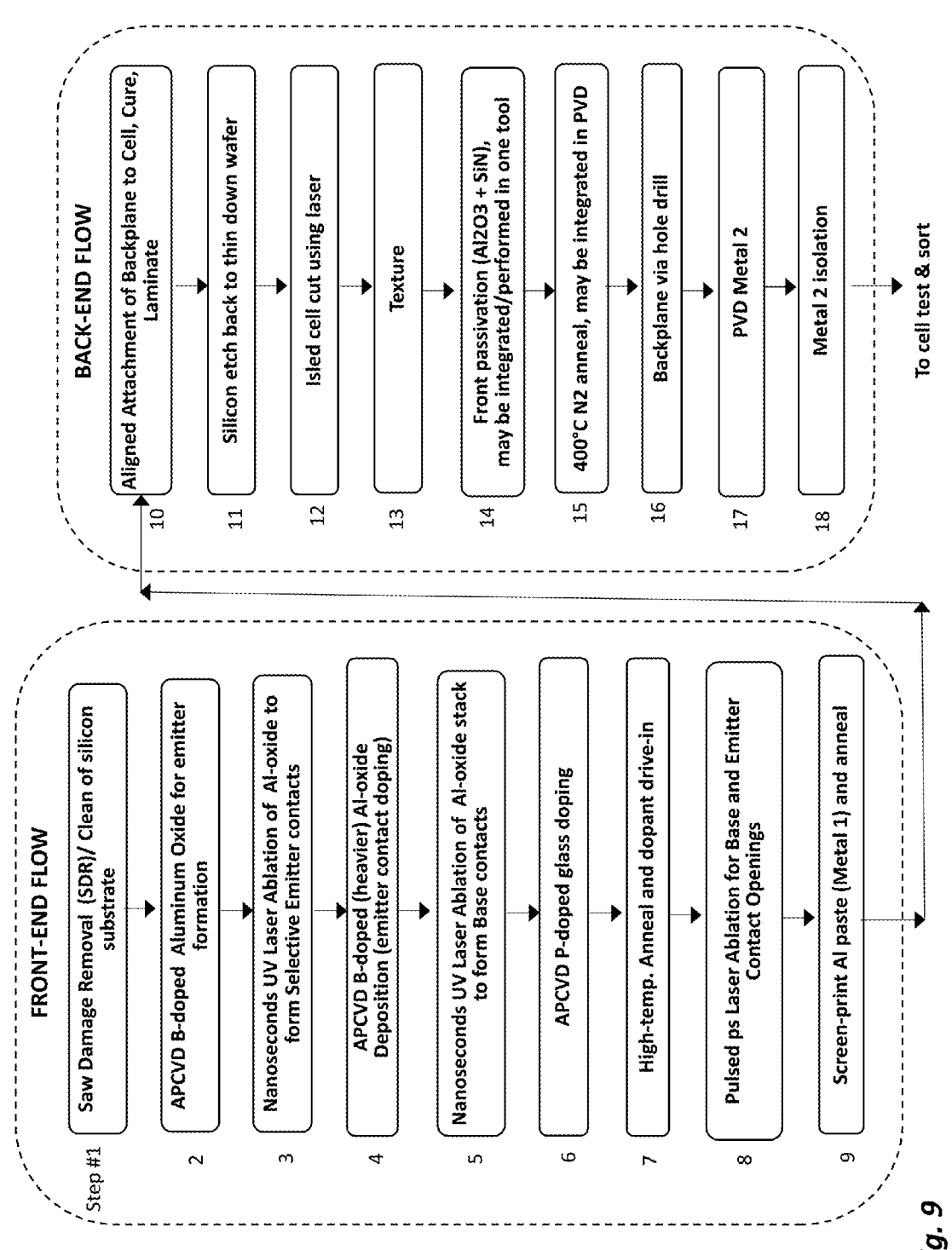
FIG. 9 is an $Al_2O_3$ based process flow for making a thin back contacted back junction backplane cell.

FIG. 9 is a process flow for making a thin (backplane supported) back contacted back junction cell which uses APCVD $Al_2O_3$ passivation on the cell backside (or non-sunnyside) for emitter formation and either ALD or PECVD $AL_2O_3$ passivation for frontside (i.e., the cell light receiving or sunnyside) passivation. $AL_2O_3$ backside deposition may perform numerous functions to increase cell efficiency and improve processing, including, for example:

Used as the source of Boron dopant to make both emitter and under-Emitter contact doping.

Used as a passivation for the emitter, and in a specific embodiment the passivation layer is the same layer as the layer used to dope and form the emitter.

Used as the film carved out using the laser with impacting minimum to zero damage to silicon. As certain specific process flows used to manufacture the IBC solar cell relies on patterning the dopant source layers to form junctions, it is imperative that the patterning technique does not cause damage to silicon. And while wet processing (e.g., wet etch) is one such method, in some instances it may be relatively expensive and also requires consumable and sacrificial layers. Laser based patterning is an elegant and robust method to pattern oxides. Laser based patterning, for example using pico second pulses, may cause damage to the underlying silicon rendering a very low bulk lifetime. However, in some instances nano-second laser used to carve out an undensified $Al_2O_3$ film deposited using APCVD may lead to minimum damage.

The process flow of FIG. 9 may result in a selective emitter IBC solar cell. As previously, the flow starts with saw damage removal (SDR) in a standard KOH chemistry (step 1). This is followed by APCVD based deposition of boron doped $Al_2O_3$ (step 2). The film may or may not be capped with an undoped USG film which is deposited in-situ in APCVD. The boron doping may be adjusted to make an emitter between 70 ohms/sq to 180 ohms/sq, where the Jo with $Al_2O_3$ passivation is minimized. For example, a Jo emitter in the range of 10-15 fA/cm2 may be achieved even after the APCVD $Al_2O_3$ film is annealed at high temperature (e.g., 950° C. to 1100° C.) to drive its boron into silicon. The APCVD doped $Al_2O_3$ film is next ablated using a nano second UV laser (step 3). In some instances, this laser may a top hat energy profile but may also have Gaussian energy profile. A unique characteristic about certain APCVD deposited $Al_2O_3$ films is a process window where $Al_2O_3$ may be ablated by nano second laser. Further, this ablation process results in very little to zero damage to silicon.

Figure 10:
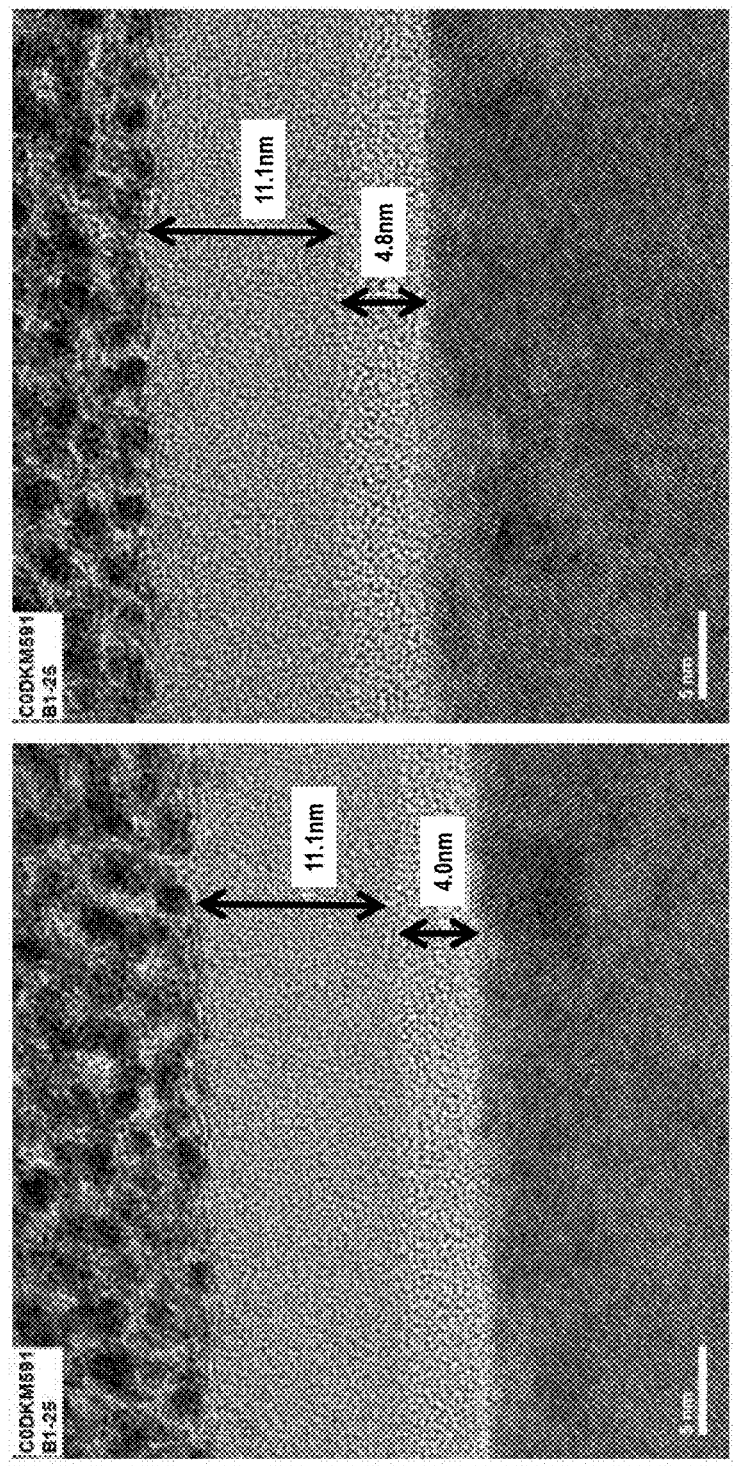
FIG. 10 is a transmission electron microscopic (TEM) photograph of APCVD boron doped Al2O3 films.
Figure 11:
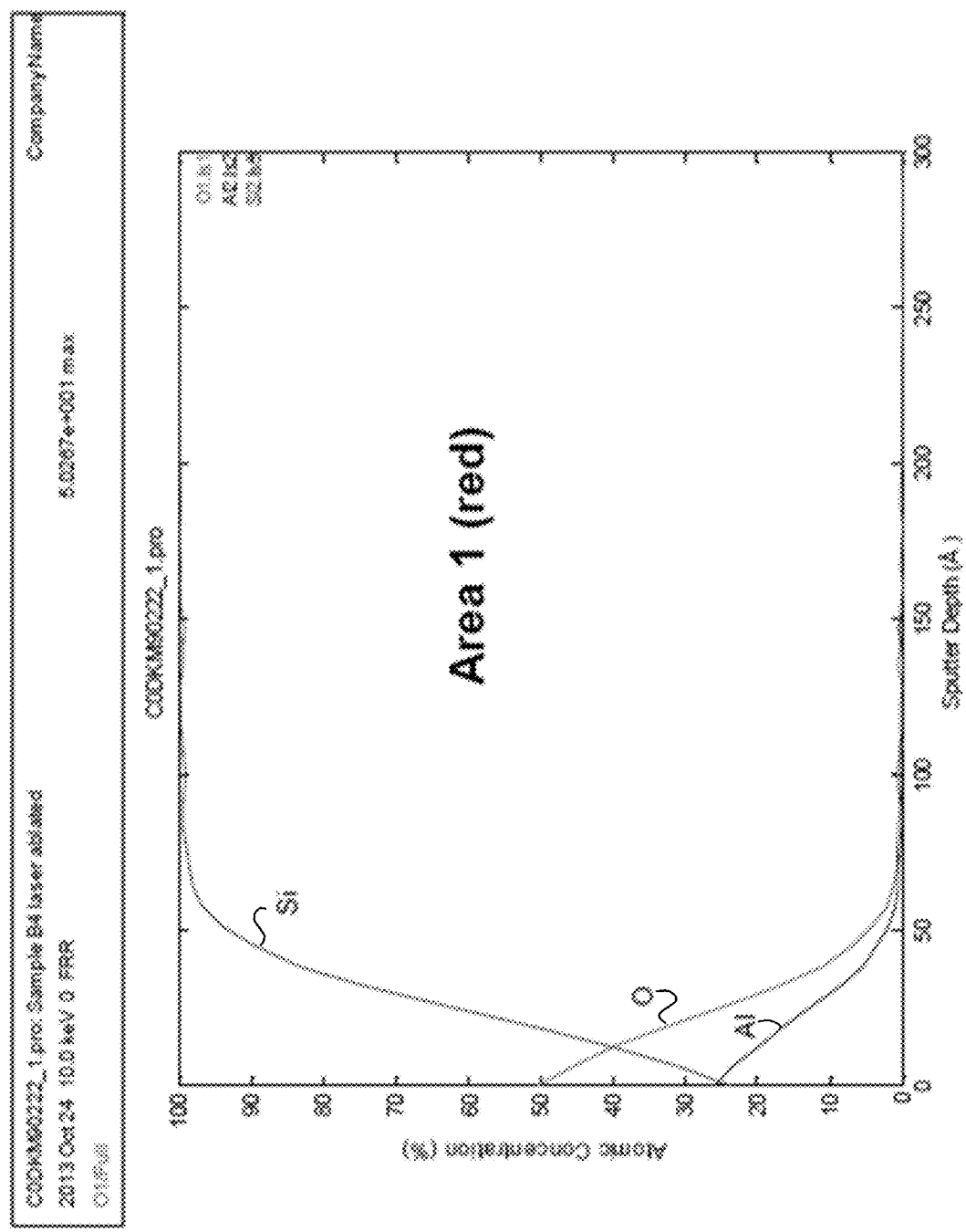
FIG. 11 is an auger profile of $Al_2O_3$ film.

Contributing factors to this effect may include that the composition of the $Al_2O_3$ film changes near the silicon interface to become rich in silicon within the first few nanometer of thickness, which serves as an excellent power dump for the laser preventing it from going into the crystalline silicon and damaging it. For reference, FIG. 10 is a transmission electron microscopic (TEM) picture of APCVD boron doped Al2O3 films showing the change in composition at the interface of approximately 4 nm. FIG. 11 is an auger profile of the $Al_2O_3$ film where a nano second laser was used to ablate and showing a transitional region near the $Al_2O_3$ interface where the $Al_2O_3$ film starts to become silicon rich. This may result in an excellent stop layer for nano second UV laser as $SiO_2$ is relatively impermeable to nano second laser. Thus, the residual silicon rich layer at the interface where the nanosecond laser stops may be clearly noted.

Figure 12:
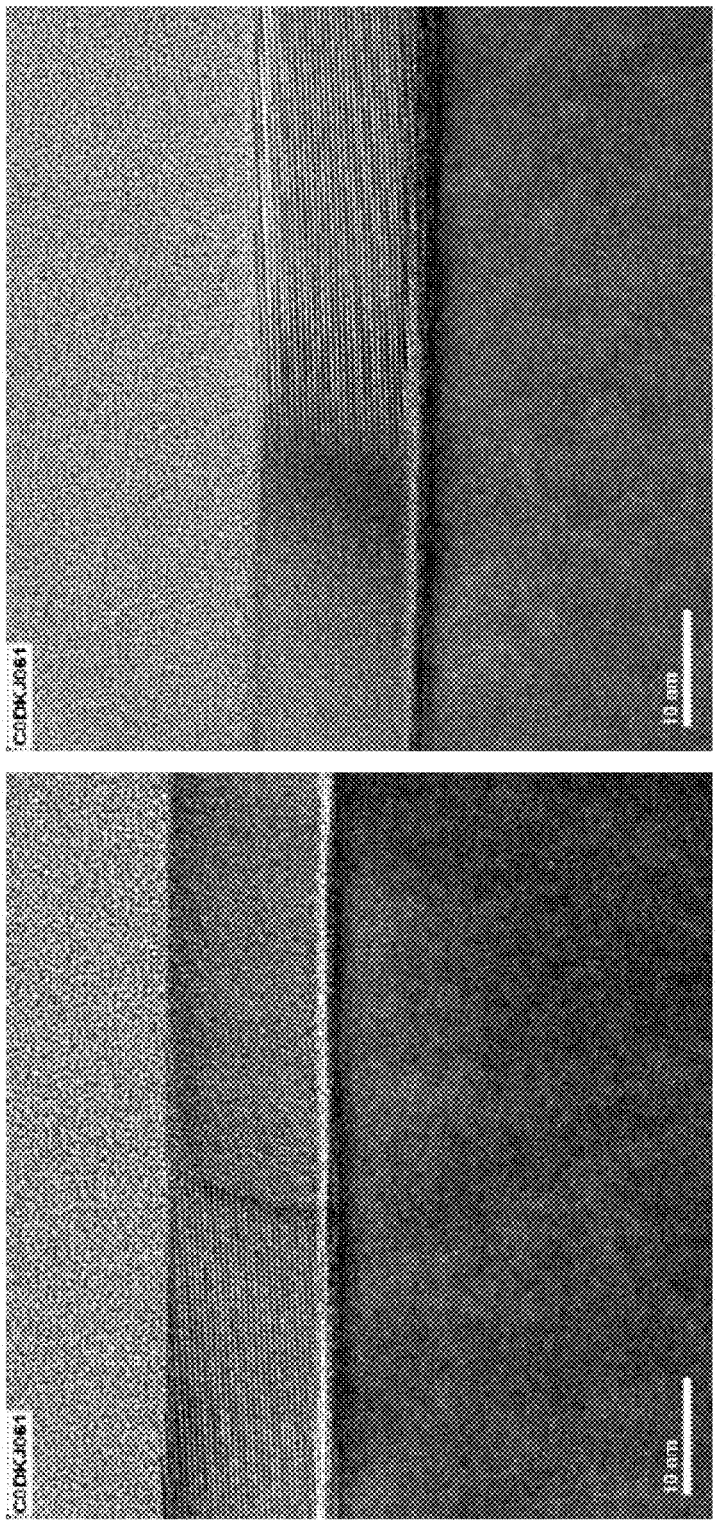
FIG. 12 is a TEM photograph of APCVD based $Al_2O_3$ film.

Referring back to FIG. 9, after the nano second laser (step 3), another APCVD Boron doped film is deposited (step 4). This layer is doped more heavily such that upon anneal it may result in less than 30 ohms/sq sheet resistance for the emitter contact. This is followed by another nano second UV laser step to open up what is called a phosphorous window (step 5). Again the laser may conducive to causing very little to no damage in silicon as previously. Following the phosphorous window open a doped PSG layer is deposited using APCVD (step 6). This layer ultimately serves as the dopant source for the base contact area. Once all the dopant sources are physically in place at their respective locations for desired junctions they are driven in at the same time at high temperature (for example a temp. in the range of 950° C. to 1100° C.) to form selective emitter and base and emitter contact doping areas (step 7). $Al_2O_3$ may crystallize at high temperatures. FIG. 12 is a TEM picture of APCVD based $Al_2O_3$ film showing crystallization after anneal. As can be seen the $Al_2O_3$ layer crystallize after anneal and retained its excellent passivation property (most likely due to fact that the aforementioned interfacial layer remained amorphous through the process). The saturation current density (Jo) of this film after anneal was measured to be as low as 13 fA/cm2 depending on the sheet resistance of the emitter. It is also observed that the Jo remains low even down to sheet resistances as low as 70 ohms/sq.

Thus, doped APCVD $Al_2O_3$ film in the cell fabrication process so far has served three purposes: 1) as the source of emitter dopants; 2) provides excellent passivation properties despite being annealed at higher temperature (for the purpose of dopant drive); and 3) reduces or eliminates damage to the underlying silicon caused by contact opening when used with nano second lasers. Further, the fact that the passivation Jo of the emitter was excellent after anneal allows this dopant source layer to be left there permanently—thus saving process steps related to dopant layer removal.

With reference to FIG. 9, after the junctions are driven in, contacts are open in the APCVD PSG (base contact) and the APCVD Al2O3 (emitter contact) nominally using a pico-second UV (or Green) laser (step 8). Note, alternatively, if the act of opening contacts using a pico-second laser is deemed to create damage in silicon, etch paste may alternatively be used to do the same. For example, etch paste may be screen printed, thermally driven to etch away the oxides, and subsequently removed.

In an alternative embodiment, and a variant of the aforementioned flow, after all the dopants are driven in after the high temperature anneal, all films may be stripped and a pristine, undoped ALD or APCVD based blanket $Al_2O_3$ film for emitter passivation may be deposited. This may or may not be followed by an extra USG on top, for example to ensure that when metallization if formed (e.g., Al paste metallization is printed) the total dielectric stack is thick enough to prevent metallization (e.g., paste) from shunting through. Subsequently, contacts to the base and emitter may be opened, for example using the two similar techniques described above.

With reference to FIG. 9, subsequent to contact open Al metal is deposited on both emitter and the base area (step 9). Patterned aluminum may be deposited using screen printing or other means such as inkjet or aerosol printing. PVD Al may also be used which is followed by patterning (e.g., by laser) to carve out the base and the emitter metal patterns. In some instances, aluminum paste may be designed with respect to the following considerations: to make excellent contacts to both p and n-type silicon at lower activation temperature, possess a resistivity from 300 to 30 uohm-cm, serve as a high quality back mirror, does not spike into silicon, and upon firing does not breach the dielectric on which it resides. A dual Al print may also be used with a slightly different second layer, printed either as a pad or as full lines, to aide in processing of subsequent steps such as via drill through the backplane (e.g., prepreg material) as described herein.

With reference to FIG. 9, subsequent to metallization, the Back-end of the process flow follows a structure suitable for making a thin silicon solar cell using backplane and dual level metallization, such as that described in detail in U.S. Pat. Pub. No. 2014/0318611 published Oct. 30, 3014 which is hereby incorporated by reference in its entirety. This includes laminating a backplane such as a prepreg material (step 10), using the prepreg to etch the silicon back and thin it down to a desired thickness such that it becomes conducive to high efficiency (step 11), using laser to isolated sub-cells on the solar cell (step 12) which is described in detail in U.S. Pat. Pub. No. 2014/0326295 published Nov. 6, 2014 and referring to the act of isolating several individually functioning smaller area solar cells held together cohesively by the prepreg after isolation. Subsequent to the isled cell cut the cell may textured (step 13). The act of texturing may also remove debris and clears up any laser damage created by isled cell laser cut. Following texture, front passivation may be deposited using myriad techniques (steps 14 and 15). Subsequently, vias are drilled in the back using a CO2 laser at a very high speed (step 16). The vias stop at the underlying aluminum paste. This is followed by the final steps of $2n^d$ level metal deposition (Metal 2 or M2) for example by PVD and Metal 2 patterning using laser (both shown steps 17 and 18). In some instance the deposited metal may be aluminum followed by nickel. M2 thickness may be in the range of 2 to 6 um as dictated by the needs of the design. The M2 patterning laser may, for example, be a nano second green or UV laser.

With reference to FIG. 9, a key novelty of the back-end process flow relates to surface passivation on the front (sunny) side. After the thin cell (30 um-120 um) is textured while supported by the backplane (step 13), an $Al_2O_3$ film is deposited on this surface which is followed by a PECVD silicon nitride film serving as the anti-reflection coating (step 14). For example, the $Al_2O_3$ film may be deposited using methods such as atomic layer deposition (ALD)—either thermal or plasma ALD—or plasma enhanced chemical vapor deposition (PECVD). PECVD deposition of $Al_2O_3$ may be advantageous in that PECVD of $Al_2O_3$ be integrated within one tool along with the PECVD SIN (such as that shown in FIG. 9). If ALD is used, there will be two separate tools: one for ALD $Al_2O_3$ and second for PECVD SiN deposition. The deposition of both films is followed by activation of the $Al_2O_3$ film using an anneal, for example at a temperature ranging from 350° C. to 425° C. (and more particularly in the range of 400° C. to 415° C.) either in N2, vacuum, or in an FGA environment (step 15). As the thin back contact back junction solar cell with the backplane that serves as a carrier for the cell it is desirable to stay within the high temperature capability of the backplane material (e.g., prepreg) which may be between 425° C. to 450° C. FIG. 9 shows an explicit step for anneal of the $Al_2O_3$ film (step 15), however, this step may be eliminated by integrating it with a slightly elevated temperature physical vapor deposition of the metal film.

$Al_2O_3$ film for front passivation is highly desirable for a thin backplane (e.g., prepreg) supported solar cells. In such a cell, the "thinning" of the cell to make it into a high efficiency cell is preformed after the supporting backplane is laminated. Thus, the final cell structure when ready for passivation is already backplane supported and the backplane limits the maximum temperature processing that may be performed on the cell, in the case of prepreg the temperature should be less than 450° C. An important function of the front surface (in addition to providing excellent passivation) is to provide stability of the passivation in the field to UV and other radiation (termed as immunity to light induced degradation or LID). Currently, passivation materials (i.e., non-$Al_2O_3$ films) may require a front surface field (FSF) to ensure that the back contacted cell does not deteriorate in the field over several years. The FSF function is to reflect minority carriers and prevent them from getting close to the front surface The FSF may consists of a heavily doped diffusion layer which is of phosphorous type (n+) for an n-type substrate, for example. Typically the formation of FSF requires diffusion at temperatures (greater than 950° C.) well above of what may be tolerated by certain backplane supported thin cells. Thus, in some instances utilizing FSF may be only an option for thin backplane supported cells when novel techniques such as laser induced dopant drive (where local temperatures at the front surface are hot but the prepreg remains relatively cool in the back) or ion implantation followed by dopant activation using laser (again as previously the back surface prepreg remains cool) are used. While these techniques are advantageous in some manufacturing environments (and based on numerous considerations such as desired cell characteristics and structure), often they are complicated, may cause damage to the front surface, and may be relatively expensive due to the addition process steps. Thus, there is a need to have a passivation material which does not require a high temperature FSF to achieve the required UV stability. Provided the right parameters are used, $Al_2O_3$ deposited by means described in this document (ALD and PECVD) is found to be stable under intense UV. In addition, $Al_2O_3$ provides an excellent passivation (e.g., with SRVs less than 10 cm/s). And although this stability may have been shown for front contact solar cells where there is an emitter on the front or in the back of the front contact cell which does not see intense UV, back contacted (e.g., n-type) cells may operate under different structural designs such that there is no heavy diffused layer under the surface and which is exposed to intense UV light. High quality starting passivation quality and stability of the film is grounded in both high quality chemical passivation and the negative fixed charge inside an $Al_2O_3$ film. It should be noted that the deposition, post deposition anneal, and sequence of SiN formation are all important optimization parameters to achieve the right stability of the film—optimizations which may, in general, be different from the film that is deposited on front contact cells or on a p-type substrate.

The solutions provided herein provide the integration of an $Al_2O_3$ film on the front side of a back contacted back junction solar backplane supported thin cell, such as that supported by a prepreg based backplane.

With respect to the backend of the process flow described in FIG. 9, the process steps (including the $Al_2O_3$ deposition) may be performed on much larger format tools. For example, once the wafers are put on a large area prepreg, several smaller form factor wafers may be put on a single large sheet of prepreg and processed together as a unit through the downstream process flow. In some instances, the size of sheet may be such that the number of wafers are conducive to being integrated in a monolithic module, thus obviating the need for certain tabbing and stringing connections as these are part of the internal wiring of the monolithic cells.

Thus, $Al_2O_3$ passivation may be used on both front (sunny side) and on the back (non-sunny side) of the solar cell. On the back side it may be specifically deposited using APCVD and serves the purpose of providing excellent emitter passivation, a boron dopant source to create the junctions in the silicon, while being conducive to patterning by nano second laser without causing damage to the silicon, and. On the sunny side it may be deposited using either thermal or plasma Atomic layer deposition (ALD) or plasma enhanced chemical vapor deposition (PECVD) and provides both excellent surface recombination velocity (SRVs less than 10 cm/s) and long term UV stability without the need for an FSF.

Advantageous integration schemes of $Al_2O_3$ films are provided in the context of thin crystalline silicon solar cells. $Al_2O_3$ solutions on one or on both sunny and non-sunny surfaces of a back contacted, back junction cell are provided for thin crystalline solar cells which are processed using backplane to thin the solar cells down.

It is entirely possible that the sunny side $Al_2O_3$ passivation may be combined with a cell fabrication process flow which does not use $Al_2O_3$ passivation for emitter, including fabrication of the back contacted back junction solar cell described herein. The process flows provided should not be taken in a limiting sense. Several tweaks, particularly with respect to the processes provided, are understood and should be obvious to those skilled in the art.

Different variations are shown in the figures below. These variations are specific to the first several steps on the cell non-sunny side (referred to as front-end processes) and share consistent back-end process steps on the cell sunnyside, including using either the ALD or PECVD deposited Al2O3 passivation on the sunny side. Again it is noted that all common backend flow steps may either be performed on individual cells or may be integrated in a monolithic fashion using a backplane sheet as described above.

Figure 13:
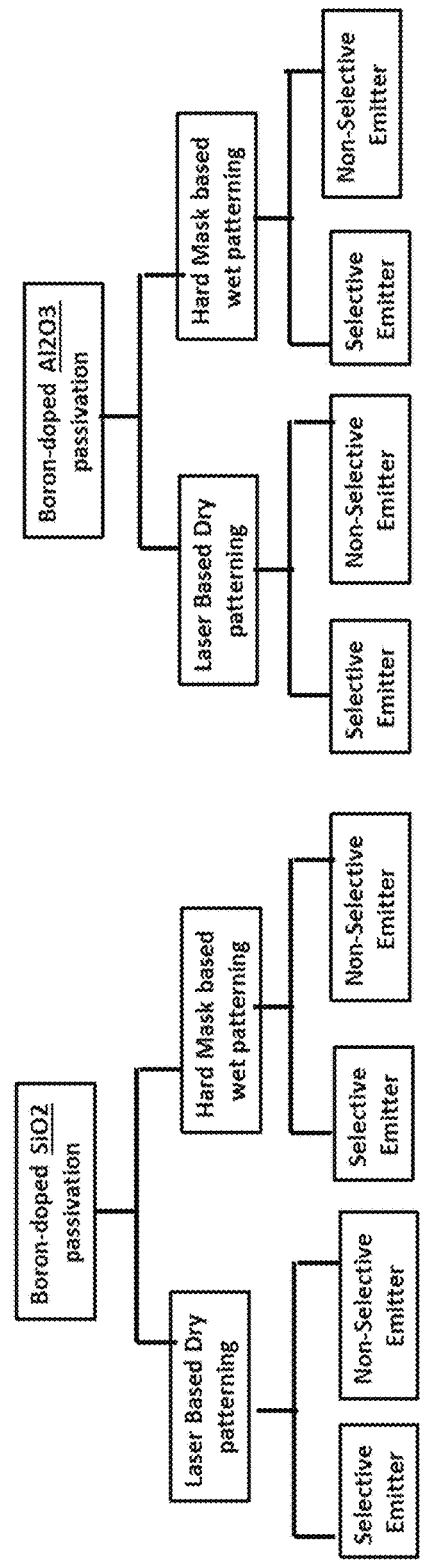
FIG. 13 is a schematic diagram showing front-end process flow embodiment classes.

Generally, front-end process flow options at a top level include boron doped $SiO_2$ OR boron doped $Al_2O_3$ each of which may utilize dry patterning or wet patterning to form selective or non-selective emitter structures. FIG. 13 shows these front-end process flow classes schematically. These front-end process flow options, the back-end processes of the process flow for different front-end process flow options may be common and consistent, such as the $Al_2O_3$ frontside (sunnyside) back-end flow for high stability shown FIG. 9.

Figure 14:
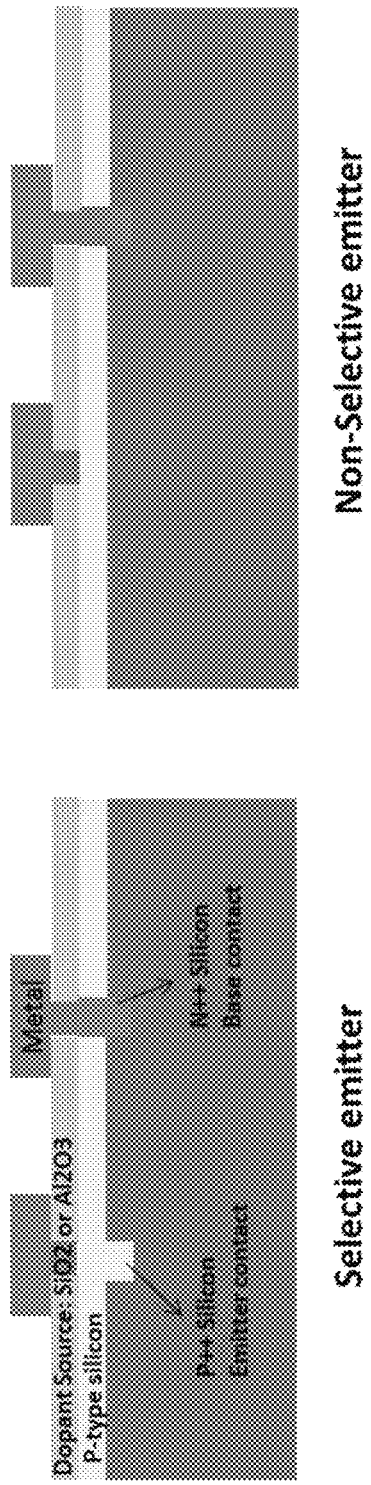
FIG. 14 is a cross-sectional diagram schematically showing a generic back contact cell with and without selective emitter.

As shown in FIG. 13, the first class of process flows uses a $SiO_2$ glass layer which is doped with boron and phosphorous. These layers may be left permanently on the cell and also form the passivation layers. In the second class of front-end process flow, $Al_2O_3$ is used as dopant source and passivation instead of $SiO_2$. $Al_2O_3$ is known to be a better passivation than SiO2 under certain instances. Under each of these two categories, there are four different combinations which arise from two different categories with two options each. The first category pertains to the method of patterning the dopant layers: using a dry laser process or using a wet process with a hard mask on top. The second category pertains to whether the device has a selective emitter or not. FIG. 14 is a cross-sectional diagram schematically showing a generic back contact cell with and without selective emitter. The device with selective emitter has a heavy doped P++ area under the emitter contact to prevent recombination of the metal. A non-selective emitter device makes emitter contact to the homogeneous emitter. Generally the number of process steps to make a selective emitter will be more than a non-selective emitter. However, it is likely that the performance of the selective emitter device in most cases will be better.

The Tables below show several different front-end process flows with and without Al2O3 which may be integrated with common back-end solar cell process flows (e.g., the back-end flows of FIG. 9 which has Al2O3 as the front side passivation on a backplane supported thin silicon solar cell.

Tables 1A through 1D below show SiO2 passivation based front-end of the process flows including selective and non-selective emitter with both dry laser patterning and with hardmasks (as shown in FIG. 13).

TABLE 1A

SiO2, Dry Laser patterned, Selective Emitter

Saw damage removal (SDR)
APCVD Boron doped SiO2 deposition
pico second UV or green laser (Define Selective emitter contact)
APCVD Boron (heavier) doped SiO2 (Doping of the emitter contact)
pico second UV or Green laser for base contact open
APCVD phosphorous doped SiO2 (PSG) doping
High Temperature Anneal and dopant drive (Formation of emitter and base junctions)
Open both Emitter and Base contacts: pico second laser
Screen print Al Paste + fire

TABLE 1B

SiO2 based, Dry Laser patterned, NON-Selective Emitter

Saw damage removal (SDR)
APCVD Boron doped SiO2 deposition
pico second UV or green laser (Define Base contact region)

TABLE 1B-continued

SiO2 based, Dry Laser patterned, NON-Selective Emitter

APCVD phosphorous doped SiO2 (PSG) doping
High Temperature Anneal and dopant drive (Formation of junctions)
Open both Emitter and Base contacts: pico second laser
Screen print Al Paste + fire

TABLE 1C

SiO2 based, Hard Mask plus wet patterned, Selective Emitter

Saw damage removal (SDR)
APCVD Boron doped SiO2 deposition, BSG 1
PECVD a-Si hard mask deposition
Pico Second UV laser to selective ablate hard mask (No damage to underlying Si)
Wet etch Boron doped SiO2, BSG1 to open to silicon
APCVD Boron (heavier), BSG2 doped SiO2 (Doping of the emitter contact)
pico second UV laser to open BSG 2 and a-SI under it. Stopping on BSG1
Wet etch Boron doped SiO2, BSG1 to open to silicon
APCVD phosphorous doped SiO2 (PSG) doping
High Temperature Anneal and dopant drive (Formation of emitter and base junctions)
Open both Emitter and Base contacts: pico second laser
Screen print Al Paste + fire

TABLE 1D

SiO2 based, Hard Mask plus wet patterned, NON-Selective Emitter

Saw damage removal (SDR)
APCVD Boron doped SiO2 deposition, BSG
PECVD a-Si hard mask deposition
Pico Second UV laser to selective ablate hard mask (No damage to underlying Si)
Wet etch Boron doped SiO2, BSG1 to open to silicon
APCVD phosphorous doped SiO2 (PSG) doping
High Temperature Anneal and dopant drive (Formation of emitter and base junctions)
Open both Emitter and Base contacts: pico second laser
Screen print Al Paste + fire For the dry laser pattern based flows shown in Tables 1A and 1B, a flat top profile laser may be advantageous to reduce damage although a Gaussian profile laser may also be used. Both UV and Green wavelengths may be used for the pulsed pico second lasers. Note, it may be disadvantageous to use nano-second laser for this purpose as it may cause heavy damage to the underlying silicon resulting in lifetime deterioration.

The hard mask plus wet process flows shown in Tables 1C and 1D may in some instances further reduce damage to the bulk caused by lasers. While picosecond lasers generally may cause less damage than nano-second lasers, they may still reduce the lifetime of the bulk silicon. To completely avoid this, a hard mask plus wet process flow such as that shown in Tables 1C and 1D may be advantageous. Considerations for the choice of the hard mask (shown in this case as a-Si) is that it should be conducive to be opened using a laser without damaging the underlying layer (as it is an absorptive layer) with the wet etch chemistry selective to the hard mask while etching the underlying dopant layer to open it up to silicon. The suggested technique shown for hard mask deposition is PECVD, however other options such as ALD can also be used with different materials, such as nitrides, as a hard mask depending on additional considerations such as cost for example. The hard mask is perma- nently part of the device and is also used again to open up the base doping area for the selective emitter flow. For the non-selective emitter flow it is used once to open up the base. With respect to Table 1D it should also be noted that when the contact is opened on the base the laser has to go through several layers such as PSG, hard masks, and BSG before it opens up to silicon.

Tables 2A through 2D are $Al_2O_3$ based front-end process flows including selective and non-selective emitter with both dry laser patterning and with hardmasks (as shown in FIG. 13) similar to the process flows of Table 1A through 1D with $Al_2O_3$ as the boron doping layer instead of the $SiO_2$ doping layer.

TABLE 2A $Al_2O_3$ based, Dry Laser patterned, Selective Emitter

Saw damage removal (SDR)
APCVD Boron doped Al2O3 for emitter formation
nano-second UV laser (Define Selective emitter contact)
APCVD Boron (heavier) doped Al2O3 (Doping of the emitter contact)
ns UV base contact open
APCVD phosphorous doped glass doping
High Temperature Anneal and dopant drive
Open both Emitter and Base contacts: pico second laser
Screen print Al Paste + fire

TABLE 2B $Al_2O_3$ based, Dry Laser patterned, NON-Selective Emitter

Saw damage removal (SDR)
APCVD Boron doped Al2O3 for emitter formation
nano-second UV laser (Define base contact area)
APCVD phosphorous doped glass doping
High Temperature Anneal and dopant drive
Open both Emitter and Base contacts: pico second laser
Screen print Al Paste + fire

TABLE 2C $Al_2O_3$ based Hard Mask plus wet patterned, Selective Emitter

2C. Al2O3 based Hard Mask + wet patterned, Selective Emitter
Saw damage removal (SDR)
APCVD Boron doped Al2O3 deposition, B1
PECVD a-Si hard mask deposition
Pico Second UV laser to selective ablate hard mask (No damage to underlying Si)
Wet etch Boron doped Al2O3, open to silicon
APCVD Boron (heavier) doped SiO2 or Al2O3
pico second UV laser to open SiO2 or Al2O3 and a-SI under it.
Wet etch Boron doped Al2O3, open to silicon
APCVD phosphorous doped SiO2 (PSG) doping
High Temperature Anneal and dopant drive (Formation of emitter and base junctions)
Open both Emitter and Base contacts: pico second laser
Screen print Al Paste + fire

TABLE 2D $Al_2O_3$ based Hard Mask plus wet patterned, NON-Selective Emitter Saw damage removal (SDR)
APCVD Boron doped Al2O3 deposition, B1
PECVD a-Si hard mask deposition
Pico Second UV laser to selective ablate hard mask (No damage to underlying Si)

TABLE 2D-continued

Al₂O₃ based Hard Mask plus wet patterned, NON-Selective Emitter

Wet etch Boron doped Al2O3, open to silicon
APCVD phosphorous doped SiO2 (PSG) doping
High Temperature Anneal and dopant drive (Formation of emitter and base junctions)
Open both Emitter and Base contacts: pico second laser
Screen print Al Paste + fire A key difference between dry $Al_2O_3$ process flows such as those shown in Tables 2A and 2B and dry $SiO_2$ based process flows such as those shown in Table 1A and 1B is that for $Al_2O_3$ a nano second UV laser may be considered advantageous over a pico second laser although a pico second laser may alternatively also be used. An advantage of a nano-second laser is that in some instances it is found to have no damage to silicon when used on an undensified APCVD deposited $AL_2O_3$ film.

For an $AL_2O_3$ based flow with selective emitter flow and using dry laser (Table 2A), the second heavier boron doped layer may also be $AL_2O_3$ or alternatively a heavy boron doped $SiO_2$ layer. However, an $AL_2O_3$ layer may be advantageous as it is conducive to being ablated without damage using a nano second laser even in cases when positioned on top of the original boron doped layer.

For front-end $AL_2O_3$ flows using a hard mask (e.g., Tables 2C and 2D), PECVD a-Si may be advantageous as a hard mask although other materials and deposition schemes such as ALD of nitride films may also be used.

$Al_2O_3$ based Front-end process flows: Stripped dopant sourced and re-deposited $Al_2O_3$. Another class of front-end process flows entails formation of the emitter and base junctions using either APCVD and/or dopant paste based screen printing. These layers are subsequently stripped and a pristine undoped $Al_2O_3$ layer is deposited for example using ALD, APCVD, or PECVD. Subsequently, both emitter and base contacts can be opened. This class of process flows may be desirable in case the passivation quality of the doped APCVD layer which serves as the dopant source is found to be lacking after the anneal to drive the dopant in. Thus, all of the aforementioned process flows with their selective and non-selective emitter renditions are included. In any of these flows, right before contact open, all layers are stripped and a pristine undoped $Al_2O_3$ film may be deposited.

An additional class of front-end process flows entails a subset of the aforementioned dry laser based flows. In these flows, after the pico second laser is used to ablate the oxide, a wet silicon etch either using KOH or TMAH is performed to remove the laser damage. Subsequently, all process steps may be followed as described herein. This wet etch step may be more conducive for integrated with a non-selective emitter flows as the risk of shunt with a selective emitter flow is higher.

Specifically, in relation to the laser damage removal noted, the etch may reduce or eliminate laser damage either by wet (or dry) etching 0.5 um to 3 um of silicon and/or using ns UV laser in combination with $Al_2O_3$ film. Importantly, etch selectivity may be selected to remove silicon while preserving passivation—e.g., whether the passivating material is doped $Al_2O_3$ or doped $Al_2O_3$ and silicate glass. Materials such as KOH and TMAH are suitable etchants. Dry etch processing may include processes such as plasma etch.

This damage removal etch may be performed after one or each of the laser ablation steps. For example, Table 3 below shows a representative process flow using a nanosecond (ns) UV laser on the emitter side and pico second (ps) laser plus wet etch on the base side to ensure there is no laser damage and a high Voc and efficiency is achieved

TABLE 3

Al₂O₃ Damage Removal Wet Etch 1, Selective Emitter

| | |
|---|---|
| 1 | SDR |
| 2 | APCVD BSG or Boron doped AL2O3 + USG (optional) |
| 3 | Laser Selective emitter open using ns UV laser |
| 4 | APCVD BSG or Boron doped Al2O3 deposition |
| 5 | Laser base window open using pico second laser (UV or Green) to remove damage |
| 6 | Etch Silicon damage away |
| 7 | APCVD PSG |
| 8 | Anneal and drive dopants |
| 9 | Laser pico or nano second contact open Emitter and base (Or use etch paste to open contacts) |
| 10 | Second anneal (850 C. to 950 C.) optional |
| 11 | Screen print AL paste |
| 12 | Anneal |

Table 4 shows yet another embodiment utilizing a laser damage removal etch. Table 4 shows a representative flow which has pico second laser plus wet silicon etch on the base side and a pico second (UV or green) laser on the emitter side. This flow may provide zero to minimal laser damage on the base window step, and in some instances may cause some damage on the emitter window open step.

TABLE 4

Al₂O₃ Damage Removal Wet Etch 2, selective emitter

| | |
|---|---|
| 1 | SDR |
| 2 | APCVD BSG or Boron doped AL2O3 + USG (optional) |
| 3 | Laser base open (ps or ns UV) |
| 4 | Etch Silicon damage away |
| 5 | Deposit APCVD PSG |
| 6 | Laser Selective emitter window open (ps UV or green) |
| 7 | Deposit APCVD BSG |
| 8 | Anneal and drive dopants |
| 9 | Laser pico or nano second contact open Emitter and base (Or use etch paste to open contacts) |
| 10 | Second anneal (850 C. to 950 C.) optional |
| 11 | Screen print AL paste |
| 12 | Anneal |

Tables 3 and 4 show silicate glass based passivation, e.g., doped $Al_2O_3$ plus USG for field emitter formation in Step 2. In another embodiment, doped $Al_2O_3$ without silicate glass may be used for passivation and diffusion region doping.

Additionally, Tables 3 and 4 show laser damage removal etch after the base opening ablation. Alternatively, a laser damage removal etch may be performed after each laser ablation which may benefit from the removal of damaged substrate while preserving passivation through etch selectivity.

The process flows outlined above should not be taken in the limiting sense. Variations around the order are implicit in the above representations and may easily be deduced by those skilled in the art. For example, order variations include, but are not limited to, interchanging the order of selective emitter and phosphorous window open steps.

The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A method for making solar cell, comprising:
depositing an undensified doped laser absorbent aluminum oxide passivation layer on a surface of a solar cell crystalline silicon substrate using atmospheric pressure chemical vapor deposition, wherein the deposition process is performed at a deposition temperature less than 450° C., said undensified doped laser absorbent aluminum oxide passivation layer having a doping opposite said solar cell crystalline silicon substrate;
patterning said undensified doped laser absorbent aluminum oxide passivation layer using laser ablation, wherein said laser ablation has a wavelength in the infrared to ultraviolet range;
etching said solar cell crystalline silicon substrate in said laser ablation pattern and removing a layer from said solar cell crystalline silicon substrate; and
annealing said crystalline silicon solar cell substrate to form diffused solar cell doped regions corresponding to said patterned undensified doped laser absorbent aluminum oxide passivation layer.

2. The method of claim 1, wherein said doped laser absorbent passivation layer is an metal rich doped laser absorbent passivation layer.

3. The method of claim 1, wherein said doped laser absorbent passivation aluminum oxide layer has a thickness in the range of 10 to 50 nm.

4. The method of claim 1, wherein said laser ablation has a pulse width in the range of 1 to 100 nanoseconds.

* * * * *